US010020295B2

(12) United States Patent
Lee

(10) Patent No.: US 10,020,295 B2
(45) Date of Patent: Jul. 10, 2018

(54) SEMICONDUCTOR DEVICE COMPRISING A PLURALITY OF DRIVERS FORMED IN DIFFERENT ACTIVE REGIONS HAVING ALL SOURCE REGIONS, DRAIN REGIONS OF A PLURALITY OF MOSFETS CONNECTED TOGETHER

(71) Applicant: SK hynix Inc., Icheon-si, Gyeonggi-do (KR)

(72) Inventor: Seol Hee Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/189,164

(22) Filed: Jun. 22, 2016

(65) Prior Publication Data
US 2017/0062402 A1  Mar. 2, 2017

(30) Foreign Application Priority Data

Aug. 26, 2015 (KR) ........................ 10-2015-0120034

(51) Int. Cl.
*H01L 27/108* (2006.01)
*H01L 27/02* (2006.01)
(52) U.S. Cl.
CPC .... *H01L 27/0207* (2013.01); *H01L 27/10897* (2013.01)
(58) Field of Classification Search
CPC ........... H01L 27/0207; H01L 27/10897; H01L 27/11898
See application file for complete search history.

(56) References Cited

U.S. PATENT DOCUMENTS

| 5,060,037 | A  | * | 10/1991 | Rountree  | H01L 27/0251 |
|           |    |   |         |           | 257/357      |
| 5,764,533 | A  | * | 6/1998  | deDood    | G06F 17/5068 |
|           |    |   |         |           | 257/204      |
| 5,780,881 | A  | * | 7/1998  | Matsuda   | H01L 27/11807|
|           |    |   |         |           | 257/202      |
| 6,815,776 | B2 | * | 11/2004 | Lee       | H01L 27/0266 |
|           |    |   |         |           | 257/355      |
| 6,995,436 | B2 | * | 2/2006  | Kawasaki  | G11C 16/0416 |
|           |    |   |         |           | 257/202      |
| 7,598,541 | B2 | * | 10/2009 | Okamoto   | H01L 21/823481|
|           |    |   |         |           | 257/205      |

(Continued)

FOREIGN PATENT DOCUMENTS

KR    1020060040788 A    5/2006

*Primary Examiner* — Anh D Mai
(74) *Attorney, Agent, or Firm* — William Park & Associates Ltd.

(57) ABSTRACT

A semiconductor device including drivers is disclosed, which can maximize driving ability of a plurality of drivers installed in a given region when the plurality of drivers is arranged in an array shape. The semiconductor device includes: a first active region; a second active region spaced apart from the first active region a predetermined distance in a first direction; a first gate finger group located in the first active region, and configured to include an odd number of gate fingers; and a second gate finger group located in the second active region, and configured to include an even number of gate fingers electrically coupled to the gate fingers of the first gate finger group.

13 Claims, 5 Drawing Sheets

(56) References Cited

U.S. PATENT DOCUMENTS

| | | | |
|---|---|---|---|
| 8,217,429 B2* | 7/2012 | Yamashita | H01L 21/823425 257/206 |
| 2004/0164407 A1* | 8/2004 | Nakajima | H01L 23/3107 257/724 |
| 2006/0098469 A1 | 5/2006 | Yang et al. | |

* cited by examiner

_US 10,020,295 B2_

SEMICONDUCTOR DEVICE COMPRISING A PLURALITY OF DRIVERS FORMED IN DIFFERENT ACTIVE REGIONS HAVING ALL SOURCE REGIONS, DRAIN REGIONS OF A PLURALITY OF MOSFETS CONNECTED TOGETHER

CROSS-REFERENCE TO RELATED APPLICATION

The present application claims priority to Korean patent application No. 10-2015-0120034 filed on 26 Aug. 2015, the disclosure of which is hereby incorporated in its entirety by reference.

BACKGROUND OF THE INVENTION

Embodiments of the present disclosure relate to a semiconductor device, and more particularly to a semiconductor device configured to maximize driving ability of a plurality of drivers installed in a given region when the plurality of drivers is arranged in an array.

Generally, it is very difficult to guarantee sufficient space needed to construct a layout of constituent elements and lines in highly integrated semiconductor devices such as DRAMs. Accordingly, it is very important to properly arrange constituent elements and lines within a restricted space in terms of a layout aspect.

FIG. 1 is a plan view illustrating conventional arrayed drivers arranged in parallel to one another according to the related art. In more detail, FIG. 1 illustrates a multi-finger arrangement structure in which each driver (DRV) includes two gate fingers.

When conventional drivers are arranged in an array, two gates for each driver are arranged to share a source as shown in FIG. 1, such that the entire arrangement region can be reduced in size. In this case, in order to arrange such gates according to the restricted rule on the condition that the size of the arrangement region is limited to a predetermined size, there is a need to guarantee a sufficiently large space between gates as compared to the length of the gates.

As a result, it is difficult to adjust a Critical Dimension (CD) of the gates, and it is also impossible to properly adjust a size of a space between a contact (M0C) configured to interconnect a metal line and an active region and each gate, resulting in deterioration of transistor characteristics.

In addition, since each driver includes two gate fingers in the arrangement structure shown in FIG. 1, a transistor width capable of being realized within a predetermined region is reduced such that a driving ability of the transistor is deteriorated. In addition, the chip region is increased in size, resulting in a reduction of the number of net dies.

In addition, since all drivers for use in the arrangement structure shown in FIG. 1 are designed to share a source, all the drivers must be formed in only one active region. As a result, the dishing and erosion amount unavoidably increases during ISO (isolation) Chemical Mechanical Polishing (CMP), such that modification of an ISO layer occurs, resulting in deterioration of circuit throughput.

BRIEF SUMMARY OF THE INVENTION

Various embodiments of the present disclosure are directed to providing a semiconductor device including drivers that substantially obviates one or more problems due to limitations and disadvantages of the related art.

The embodiments of the present disclosure relate to a technology for maximizing driving ability of drivers within a restricted region by improving an arrangement structure of the drivers for use in a semiconductor device.

In accordance with an aspect of the present disclosure, a semiconductor device includes: a first active region; a second active region spaced apart from the first active region a predetermined distance in a first direction; a first gate finger group located in the first active region, and configured to include an odd number of gate fingers; and a second gate finger group located in the second active region, and configured to include an even number of gate fingers electrically coupled to the gate fingers of the first gate finger group.

In accordance with another aspect of the present disclosure, a semiconductor device includes: a first driver and a second driver, each of which includes a first gate finger group including an odd number of gate fingers and a second gate finger group including an even number of gate fingers, the first gate finger group being spaced apart from the second gate finger group a predetermined distance in a first direction. The first driver and the second driver are arranged adjacent to each other in a second direction crossing the first direction in a manner that a position of the first gate finger group is opposite to a position of the second gate finger group.

The semiconductor device may further include: a third driver and a fourth driver, each of which includes a third gate finger group including an odd number of gate fingers and a fourth gate finger group including an even number of gate fingers. The third gate finger group may be spaced apart from the fourth gate finger group a predetermined distance in the first direction. The third driver may be arranged symmetrical to the second driver in a second direction, and the fourth driver may be arranged symmetrical to the first driver in the second direction.

In accordance with yet another aspect of the present disclosure, a semiconductor device includes a plurality of drivers, where each driver includes a first gate finger group including an odd number of gate fingers and a second gate finger group including an even number of gate fingers, the first gate finger group being spaced apart from the second gate finger group in a first direction. Further, the plurality of drivers includes a first plurality of drivers and a second plurality of drivers, the first plurality drivers including the first gate finger groups located in a same active region and second gate finger groups located in different active regions.

It is to be understood that both the foregoing general description and the following detailed description are for example and explanatory and are intended to provide further explanation of the claims.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 2:
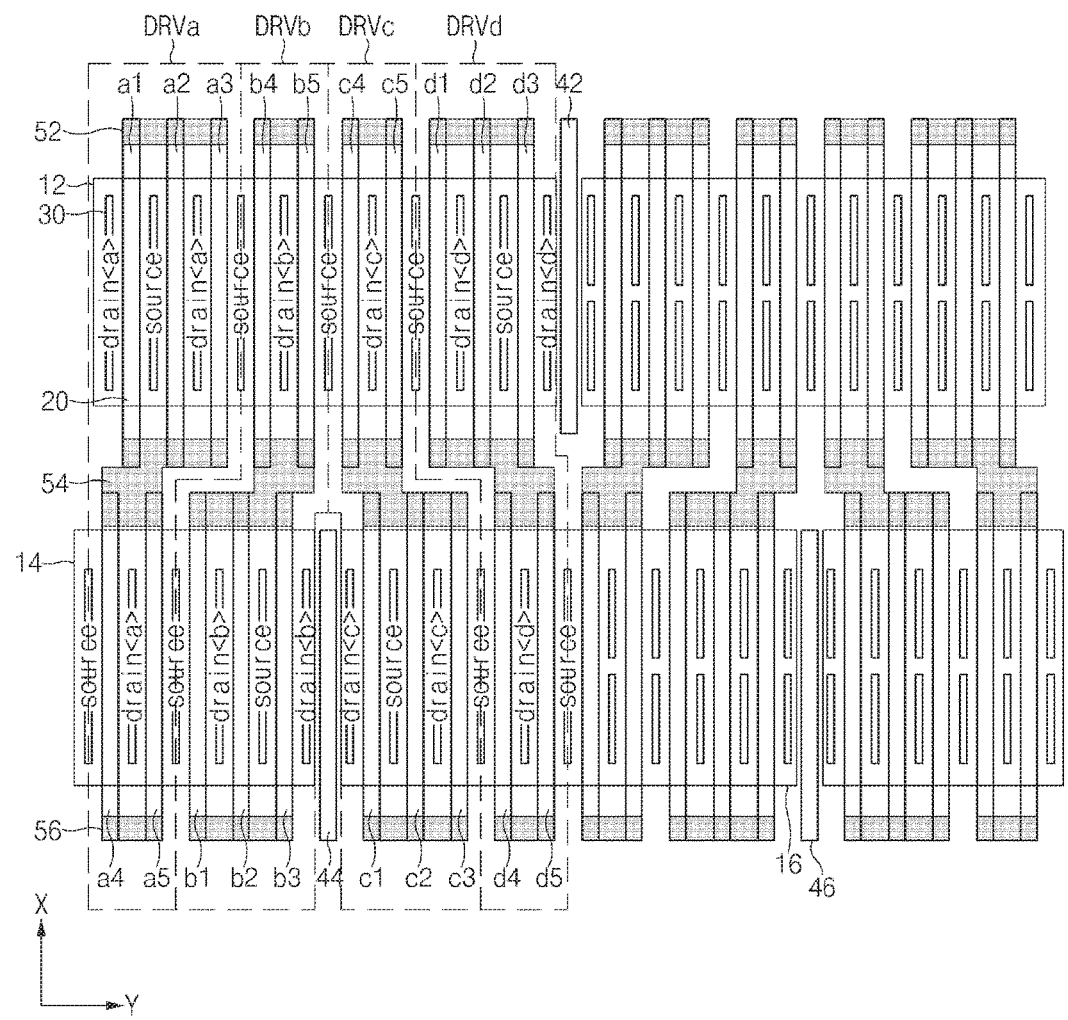
FIG. 2 is a plan view illustrating an arrangement of a structure of drivers according to an embodiment of the present disclosure.

FIG. 2 is a plan view illustrating an arrangement structure of drivers according to an embodiment of the present disclosure.

FIG. 2 illustrates an example case in which 5 finger gates 20 are formed in one driver according to an embodiment of the present disclosure. Although only some drivers (DRVa~DRVd) are shown in FIG. 2 for convenience of description, the scope or spirit of the present disclosure is not limited thereto.

Referring to FIG. 2, a driver (DRVa) may include an odd number of gate fingers (i.e., 5 gate fingers) (a1~a5) electrically coupled to one another, a driver (DRVb) may include an odd number of gate fingers (b1~b5) electrically coupled to one another, a driver (DRVc) may include an odd number of gate fingers (c1~c5) electrically coupled to one another, and a driver (DRVd) may include an odd number of gate fingers (d1~d5) electrically coupled to one another. Gate fingers of each driver (DRVa~DRVd) may be classified into two groups in an X-axis direction (i.e., a first direction). In accordance with the embodiment, odd gate fingers (i.e., 5 gate fingers) are formed in a given region of each driver (DRVa~DRVd), the odd gate fingers are classified into two groups (i.e., one group composed of an odd number of gate fingers (i.e., 3 gate fingers) and the other group composed of an even number of gate fingers (i.e., 2 gate fingers)), such that the 5 gate fingers of each driver (DRVa~DRVd) are interconnected through conductive materials (52, 54, 56). In this case, the region occupied by each driver (DRVa~DRVd) shown in FIG. 2 may be substantially identical in size to the region occupied by each driver shown in FIG. 1.

For convenience of description and better understanding of the present disclosure, a first active region in which an odd number of gate fingers are arranged in parallel within each driver is referred to as a first gate finger group, and a second active region in which an even number of gate fingers are arranged in parallel within each driver is referred to as a second gate finger group.

In FIG. 2, the driver (DRVa) may include three gate fingers (a1, a2, a3) formed over the active region 12; and two gate fingers (a4, a5) formed over another active region 14 spaced apart from the active region 12 a predetermined distance in an X-axis direction. In this case, the end part of the gate fingers (a1, a2, a3) of the first gate finger group may be electrically coupled to an end part of the gate fingers (a4, a5) of the second gate finger group, such that 5 gate fingers (a1~a5) may be electrically coupled to one another. In addition, the gate fingers (a1, a2, a3) of the first gate finger group and the gate fingers (a4, a5) of the second gate finger group are arranged in a zigzag manner, that is, not on a same line.

The position of the gate fingers (b1, b2, b3) of the first gate finger group and the position of the gate fingers (b4, b5) of the second gate finger group for use in the driver (DRVb) may be opposite to those of the driver (DRVa). That is, whereas the gate fingers (a1, a2, a3) of the first gate finger group for use in the driver (DRVa) may be located on the right (R) side (i.e., an upper part of FIG. 2) of the driver (DRVa) and the gate fingers (a4, a5) of the second gate finger group for use in the driver (DRVa) are located on the left (L) side (i.e., a lower part of FIG. 2) of the driver (DRVa); the gate fingers (b1, b2, b3) of the first gate finger group for use in the driver (DRVb) may be located on the left side of the driver (DRVb) and the gate fingers (b4, b5) of the second gate finger group for use in the driver (DRVb) are located on the right side of the driver (DRVb). In this case, the gate fingers (a1, a2, a3) of the driver (DRVa) and the gate fingers (b4, b5) of the driver (DRVb) are located in the same active region 12, and the gate fingers (a4, a5) of the driver (DRVa) and the gate fingers (b1, b2, b3) of the driver (DRVb) are also located in the same active region 14.

As described above, the drivers (DRVa, DRVb) adjacent to each other in the Y-axis direction are designed to share the same active region 12, and the gate fingers of the first and second gate finger groups of the driver (DRVa) are located opposite to those of the driver (DRVb), the entire region occupied by the drivers (DRVa, DRVb) arranged in an array shape can be minimized in size.

Further, the driver (DRVc), adjacent to the driver (DRVb) in the Y-axis direction, may be arranged symmetrical to the driver (DRVb) in the X-axis direction. That is, the driver (DRVc) may include two gate fingers (c4, c5) formed over the active region 12, and three gate fingers (c1, c2, c3) formed over an active region 16 spaced apart from the active region 12 a predetermined distance in the X-axis direction.

The driver (DRVd), adjacent to the driver (DRVc) in the Y-axis direction, may be arranged symmetrical to the driver (DRVa) in the X-axis direction. That is, the driver (DRVd) may include three gate fingers (d1, d2, d3) formed over the active region 12, and two gate fingers (d4, d5) formed over the active region 16. Similarly, the driver (DRVa) may include three gate fingers (a1, a2, a3) formed over the active region 12, and two gate fingers (a4, a5) formed over the active region 14. In other words, in the same manner as in the above-mentioned drivers (DRVa, DRVb), the gate fingers of the first and second gate finger groups of the driver (DRVc) are located opposite to those of the driver (DRVd).

In this case, the gate fingers (c4, c5) of the driver (DRVc) and the gate fingers (d1, d2, d3) of the driver (DRVd) are located in the same active region 12, and the gate fingers (c1, c2, c3) of the driver (DRVc) and the gate fingers (d4, d5) of the driver (DRVd) are located in the same active region 16. That is, gate fingers of each driver (DRVa~DRVd) may be formed across two active regions spaced apart from each other a predetermined distance in the X-axis direction. The gate fingers of the first or second gate finger group of 4 drivers (DRVa~DRVd) may share each active region (12, 14, 16).

Dummy gates (42, 44, 46) may be interposed between the active regions (12, 14, 16). The dummy gates may be formed in consideration of a connection relationship between the dummy gate and other lines (e.g., bit lines) contained in the semiconductor device, and may be omitted as necessary.

Figure 1:
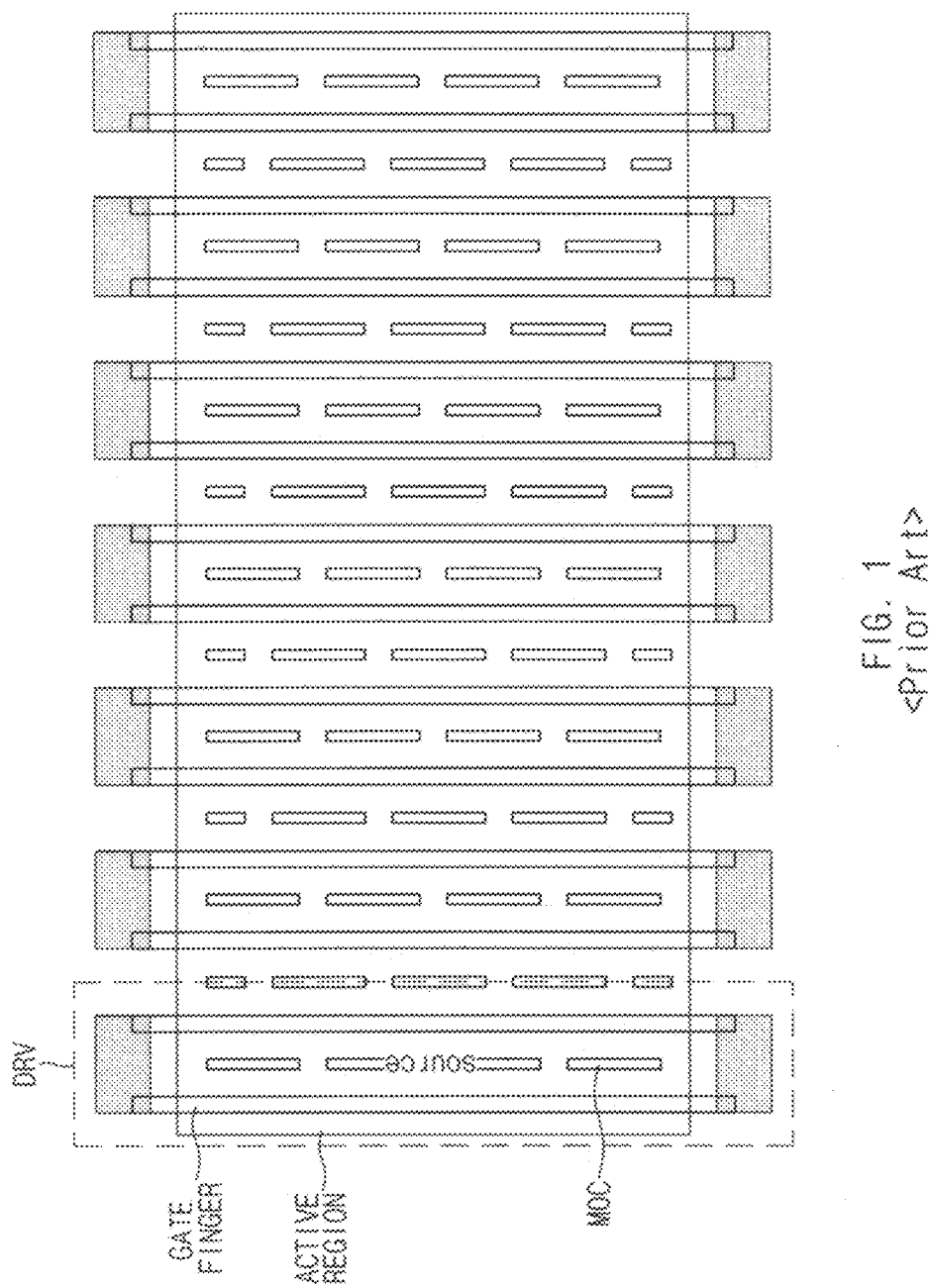
FIG. 1 is a plan view illustrating conventional arrayed drivers arranged in parallel to one another according to the related art.

As illustrated in the above-mentioned arrangement structure of FIG. 2, a source region shared by an odd number of gate fingers (e.g., 5 gate fingers) for use in each driver (DRVa~DRVd) may be larger in size than a source region shared by an even number of gate fingers (e.g., 2 gate fingers) for use in each driver shown in FIG. 1.

As described above, assuming that each driver includes 5 gate fingers classified into two groups as shown in FIG. 2, the driving ability of FIG. 2 may be higher than that of the structure shown in FIG. 1 by about 25%, as compared to the conventional art of FIG. 1 in which two gate fingers (i.e., 2 fingers) are formed within the same active region.

Although the embodiment of FIG. 2 has shown an example disclosing that each driver includes 5 gate fingers for convenience of description and better understanding of the present disclosure, it should be noted that each driver may also include 7 gate fingers or 9 gate fingers according to the area of the allocated driver. In the example having 7 gate fingers, each driver may be configured in a manner such that 4 gate fingers are formed in the first gate finger group and 3 gate fingers are formed in the second gate finger group.

Figure 3:
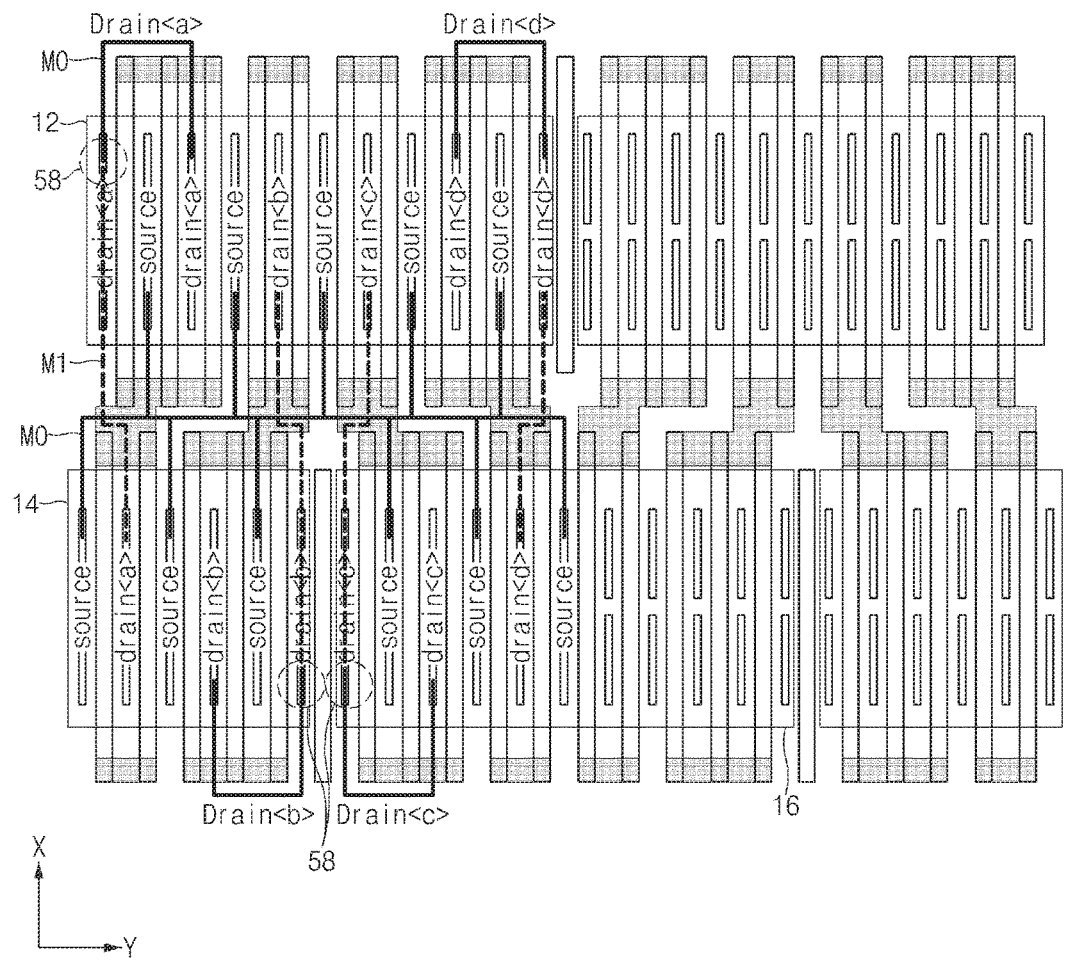
FIG. 3 is a plan view illustrating a connection format among source regions and drain regions when a power supply is emphasized in the arrangement structure shown in FIG. 2.

FIG. 3 is a plan view illustrating a connection format among source regions and drain regions when a power supply is emphasized in the arrangement structure shown in FIG. 2. The connection relationship of FIG. 3 is shown only in association with drivers belonging to a specific portion of FIG. 2.

Connection between the source region and the drain region of each transistor configured to construct each driver (DRVa~DRVd) may be changed according to which one of a power (PWR) supplied to the source region and a signal connection to the drain region is more important.

In accordance with this embodiment, a metal line (M0) may be disposed in a region interposed between two groups (i.e., the right active regions (see the upper part of FIG. 3) and the left active regions (see the lower part of FIG. 3)) of each driver, and all the source regions requesting power supply may be interconnected in the form of a fork. That is, all the source regions of the drivers (DRVa~DRVd) may be commonly coupled to one another through the metal line (M0) having a same level (i.e., Level 0 which is below Level 1), and the corresponding metal line (M0) may be coupled to the power line (PWR).

As described above, power is supplied to all the source regions using a same-level of metal lines, such that resistance is minimized and power supply is facilitated, resulting in an increased driving ability of each driver.

On the other hand, when using signal connections to the drain regions, contiguous drain regions located in the same group as each driver (DRVa~DRVd) may be interconnected through the same metal line (M0), and other drain regions located in another group may be interconnected through a metal line (M1) having a higher level (i.e., Level 1 which is above Level 0).

For example, in the case of using the driver (DRVa), two drain regions (drain<a>) located in the active region 12 may be commonly coupled to each other through the metal line (M0), and the corresponding line may be commonly coupled to the at least one drain region (drain<a>) located in the active region 14 through the metal line (M1) and a contact 58. In the case of using the driver (DRVb), two drain regions (drain<b>) located in the active region 14 may be commonly coupled to each other through the metal line (M0), and a corresponding line may be commonly coupled to the at least one drain region (drain<b>) located in the active region 12 through the metal line (M1) and a contact 58. In the case of using the driver (DRVc), two drain regions (drain<c>) located in the active region 16 may be commonly coupled to each other through the metal line (M0), and a corresponding line may be commonly coupled to the at least one drain region (drain<c>) located in the active region 12 through the metal line (M1) and a contact 58. In the case of using the driver (DRVd), two drain regions (drain<d>) located in the active region 12 may be commonly coupled to each other through the metal line (M0), and a corresponding line may be commonly coupled to the at least one drain region (drain<d>) located in the active region 16 through the metal line (M1) and a contact 58.

In other words, a signal connection (i.e., connection between the drain regions) may be formed using different levels of metal lines (M0, M1) and the contact 58. Further, the signal connection may have a relatively lower significance as compared to power connection (i.e., connection between the source regions).

Figure 4:
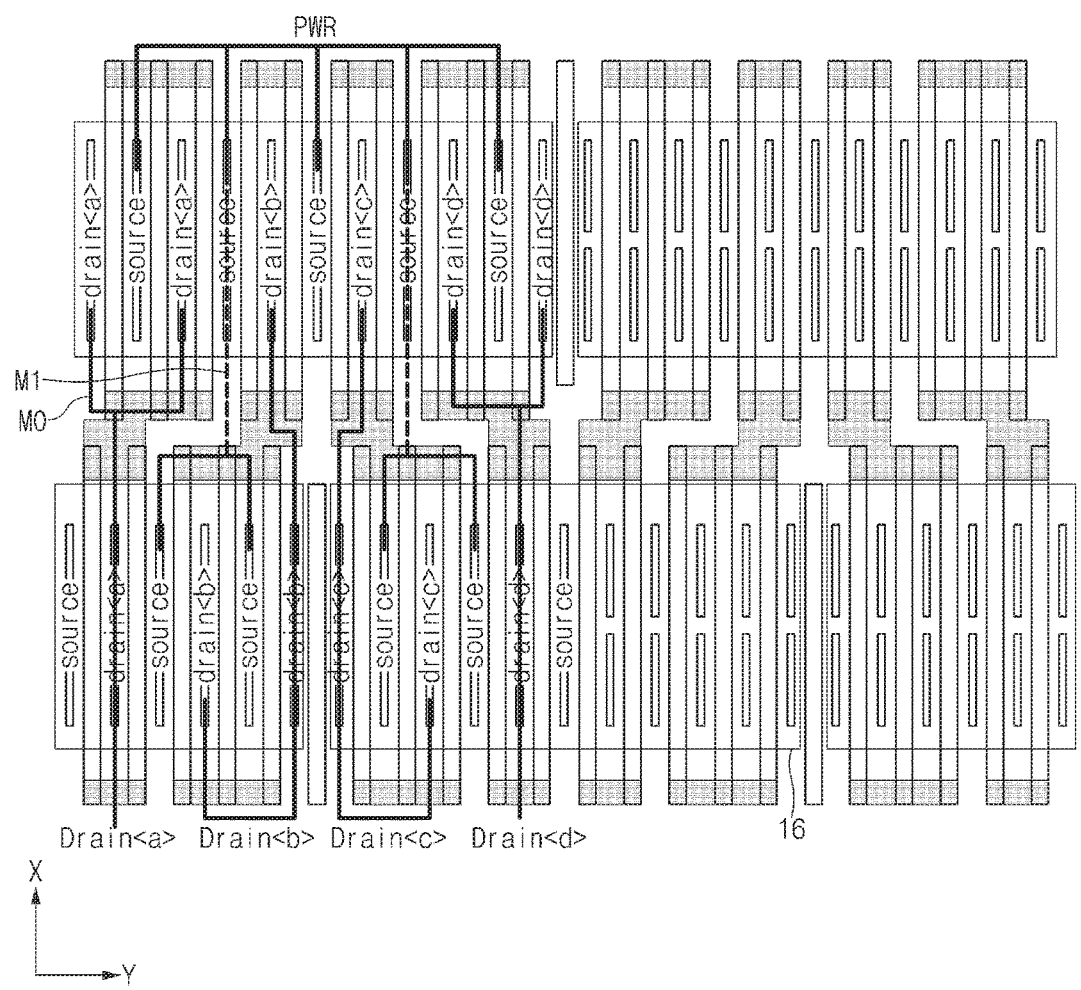
FIG. 4 is a plan view illustrating a connection format among source regions and drain regions of metal when a signal connection is emphasized in the arrangement structure shown in FIG. 2.

FIG. 4 is a plan view illustrating a connection format among source regions and drain regions of metal when a signal connection is emphasized using the arrangement structure shown in FIG. 2. The connection relationship of FIG. 4 is shown only in association with drivers belonging to a specific portion of FIG. 2.

Referring to FIG. 4, the drain regions of each driver (DRVa~DRVd) may be commonly coupled to one another through the same-level of metal lines (M0), resulting in reduction of signal resistance. That is, as illustrated in FIG. 3, the drain regions located in the same group (i.e., the group including 3 gate fingers) may be interconnected through the same-level metal line (M0), and the drain regions located in another group may be interconnected through the high-level metal line (M1). However, the structure shown in FIG. 4 illustrates that the drain regions for each driver (DRVa~DRVd) are interconnected through the same-level metal line (M0).

In addition, the source regions located in the same group may be commonly coupled to one another through the metal line (M0), and the source regions located in an other group may be coupled to one another through the high-level metal line (M1).

As illustrated in FIGS. 3 and 4, one connection to be emphasized is selected from among a first connection between the source regions needed for power supply and a second connection between the drain regions needed for signal transmission, and the metal line (M0) having a zero level (i.e., Level 0) is first allocated to the selected one connection such that the corresponding parts may be interconnected through the same-level metal lines (M0), resulting in implementation of minimum line resistance. In contrast, in the case of using the other connection having relatively lower significance, assuming that the number of metal lines (M0) is considered insufficient, the corresponding parts may be interconnected through the high-level metal lines (M1) and the contact.

As is apparent from the above description, the embodiments of the present disclosure can improve operational characteristics of the semiconductor device by improving driving ability of drivers within a restricted region.

The embodiments can increase the degree of freedom during a predetermined process in which the length of gates and the space between the gates are decided, resulting in implementation of desired transistor characteristics.

Those skilled in the art will appreciate that embodiments of the present disclosure may be carried out in other ways than those set forth herein without departing from the scope and characteristics of these embodiments. The above embodiments are therefore to be construed in all aspects as illustrative and not restrictive.

The above embodiments of the present disclosure are illustrative and not limitative. Various alternatives and equivalents are possible. The invention is not limited by the type of deposition, etching polishing, and patterning steps described herein. Nor are embodiments limited to any specific type of semiconductor devices. For example, embodiments may be implemented in a dynamic random access memory (DRAM) device or non volatile memory device. Other additions, subtractions, or modifications are obvious in view of the present disclosure and are intended to fall within the scope of the appended claims.

Figure 5:
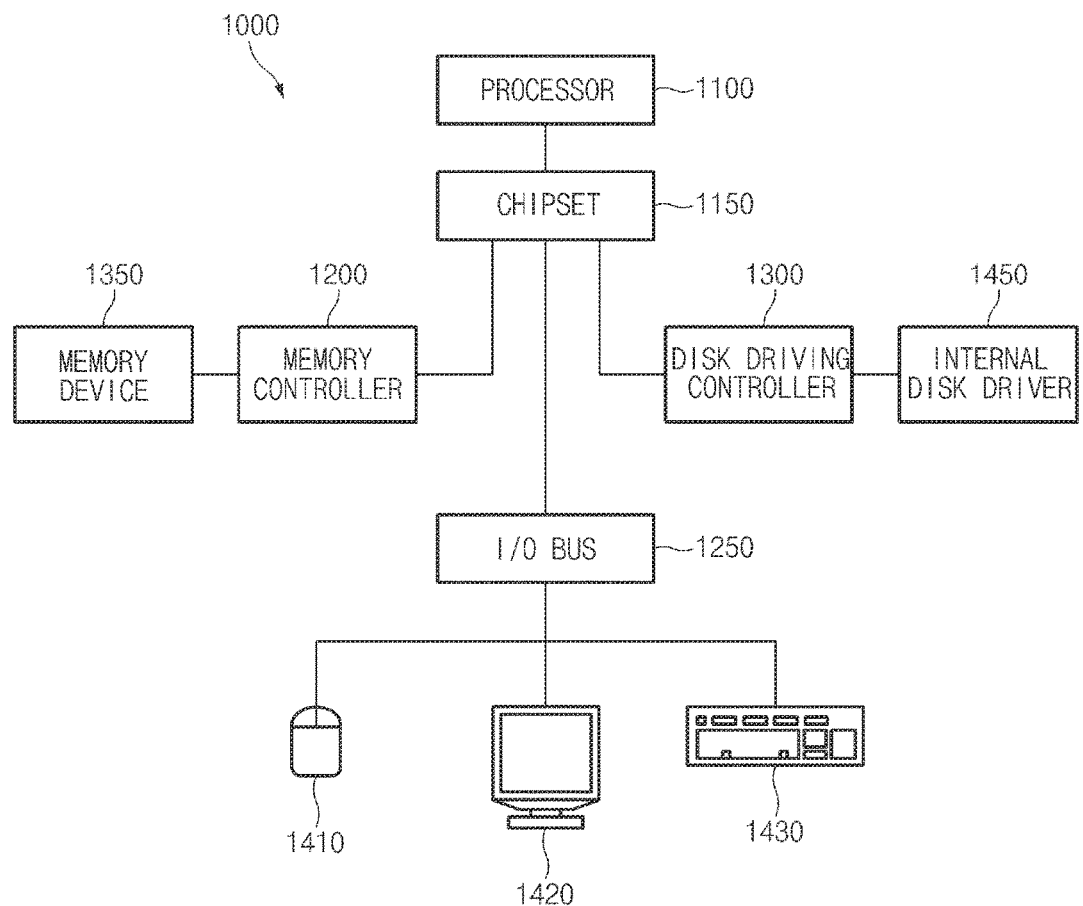
FIG. 5 illustrates a block diagram of a system employing a semiconductor device in accordance with the various embodiments discussed above with relation to FIGS. 1-4.

The semiconductor devices and/or drivers discussed above (see FIGS. 1-4) are particular useful in the design of memory devices, processors, and computer systems. For example, referring to FIG. 5, a block diagram of a system employing a semiconductor device and/or drivers in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or driver as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or driver as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor device and/or driver as discussed above with relation to FIGS. 1-4. In alternate embodiments, such as, for example but not limited to, cellular phones or digital cameras, the components may differ from the embodiments illustrated in FIG. 5.

What is claimed is:

1. A semiconductor device comprising:
   a first driver and a second driver, each of which includes
      a first gate finger group including odd gate fingers and
      a second gate finger group including even gate fingers,
      the first gate finger group being spaced apart from the second gate finger group a predetermined distance in a first direction,
   wherein the first driver and the second driver are arranged
      adjacent to each other in a second direction crossing the first direction in a manner that a position of the first gate finger group is opposite to a position of the second gate finger group, and
   wherein all source regions of the first driver and the second driver are commonly coupled to each other, all drain regions of the first driver are commonly coupled to each other only within the first driver and all drain regions of the second driver are commonly coupled to each other only within the second driver.

2. The semiconductor device according to claim 1, wherein: in each of the first driver and the second driver, the first gate finger group and the second gate finger group are located in different active regions.

3. The semiconductor device according to claim 1, wherein the first gate finger group of the first driver and the second gate finger group of the second driver are located in a same active region.

4. The semiconductor device according to claim 1, wherein the second gate finger group of the first driver and the first gate finger group of the second driver are located in a same active region.

5. The semiconductor device according to claim 1, wherein: in each of the first driver and the second driver, the gate fingers of the first gate finger group are commonly coupled to the gate fingers of the second gate finger group.

6. The semiconductor device according to claim 1, further comprising:
   a third driver and a fourth driver, each of which includes
      a third gate finger group including an odd number of gate fingers and a fourth gate finger group including an even number of gate fingers, the third gate finger group being spaced apart from the fourth gate finger group a predetermined distance in the first direction,
   wherein the third driver is arranged symmetrically to the second driver in a second direction, and the fourth driver is arranged symmetrically to the first driver in the second direction.

7. The semiconductor device according to claim 6, wherein the first gate finger group of the first driver, the second gate finger group of the second driver, the fourth gate finger group of the third driver, and the third gate finger group of the fourth driver are located in a same active region.

8. The semiconductor device according to claim 6, further comprising:
- a first connection line configured to commonly interconnect source regions of the first to fourth drivers;
- a second connection line configured to commonly interconnect drain regions located in a same active region in each of the first to fourth drivers; and
- a third connection line configured to commonly interconnect drain regions located in different active regions in each of the first to fourth drivers.

9. A semiconductor device comprising:
- a plurality of drivers, where each driver includes a first gate finger group including an odd number of gate fingers and a second gate finger group including an even number of gate fingers, the first gate finger group being spaced apart from the second gate finger group in a first direction,
- wherein the plurality of drivers includes a first plurality of drivers and a second plurality drivers, the first plurality of drivers including first gate finger groups located in a same active region and second gate finger groups located different active regions, and
- wherein all source regions of the plurality of drivers are commonly coupled to each other and all drain regions in each of the plurality drivers are commonly coupled to each other only within the corresponding driver.

10. The semiconductor device according to claim 9, wherein the second plurality of drivers includes first gate finger groups located in different active regions, and second gate finger groups located in a same active region.

11. The semiconductor device according to claim 10, wherein:
- the first plurality of drivers includes a first driver including a first gate finger group in a first active region and a second gate finger group in a second active region;
- the second plurality of drivers includes a second driver including a first gate finger group in the second active region and a second gate finger group in the first active region;
- the second plurality of drivers includes a third driver including a first gate finger group in a third active region and a second gate finger group in the first active region; and
- the first plurality of drivers includes a fourth driver including a first gate finger group in the first active region and a second gate finger group in the third active region.

12. The semiconductor device according to claim 11, wherein in each of the first driver and the second driver, the gate fingers of the first gate finger group are commonly coupled to the gate fingers of the second gate finger group.

13. The semiconductor device according to claim 11, further comprising:
- a first connection line configured to interconnect drain regions of the first to fourth drivers;
- a second connection line configured to commonly interconnect drain regions located in a same active region in each of the first to fourth drivers; and
- a third connection line configured to commonly interconnect drain regions located in different active regions in each of the first to fourth drivers.

* * * * *